US009313077B2

(12) United States Patent
Morris et al.

(10) Patent No.: US 9,313,077 B2
(45) Date of Patent: Apr. 12, 2016

(54) METHOD AND FREQUENCY AGILE PRE-DISTORTED TRANSMITTER USING PROGRAMMABLE DIGITAL UP AND DOWN CONVERSION

(75) Inventors: Bradley John Morris, Ottawa (CA); Lars Johan Thorebäck, Sundbyberg (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 539 days.

(21) Appl. No.: 13/128,466

(22) PCT Filed: Nov. 18, 2010

(86) PCT No.: PCT/IB2010/002941
§ 371 (c)(1),
(2), (4) Date: Sep. 21, 2011

(87) PCT Pub. No.: WO2012/066370
PCT Pub. Date: May 24, 2012

(65) Prior Publication Data
US 2012/0128099 A1    May 24, 2012

(51) Int. Cl.
*H04L 25/03* (2006.01)
*H04L 27/36* (2006.01)
*H03F 1/32* (2006.01)

(52) U.S. Cl.
CPC ............ *H04L 27/368* (2013.01); *H03F 1/3247* (2013.01); *H03F 1/3294* (2013.01); *Y10T 29/4913* (2015.01)

(58) Field of Classification Search
CPC ................... H03G 3/3052; H04B 7/04

USPC ............................................. 375/297; 455/73
See application file for complete search history.

(56) References Cited

U.S. PATENT DOCUMENTS

| 2,581,594 | A | * | 1/1952 | MacSorley | 455/256 |
|---|---|---|---|---|---|
| 6,141,372 | A | * | 10/2000 | Chalmers | 375/147 |
| 6,993,464 | B2 | * | 1/2006 | Chiu et al. | 703/2 |
| 7,408,979 | B2 | * | 8/2008 | Kodavati | 375/219 |
| 7,961,045 | B2 | * | 6/2011 | Morris et al. | 330/149 |
| 2003/0179831 | A1 | | 9/2003 | Gupta et al. | |
| 2004/0032912 | A1 | | 2/2004 | Ocenasek et al. | |
| 2004/0190660 | A1 | * | 9/2004 | Morris et al. | 375/350 |
| 2005/0090219 | A1 | * | 4/2005 | Kang et al. | 455/296 |
| 2005/0163249 | A1 | * | 7/2005 | McCallister | 375/296 |

(Continued)

FOREIGN PATENT DOCUMENTS

EP          2019486 A1    1/2009
JP          2008091985 A    4/2008

OTHER PUBLICATIONS

PCT International Preliminary Report on Patentability for corresponding International Application No. PCT/IB2010/002941 mailed Feb. 1, 2013.

(Continued)

*Primary Examiner* — Helene Tayong
(74) *Attorney, Agent, or Firm* — Patent Portfolio Builders PLLC (57) ABSTRACT

Pre-distorted transmitters operable over a wide range of frequencies including a plurality of predetermined frequency bands are provided. The transmitters include a programmable digital up-converter and a programmable digital down-converter, an ADC, a DAC, a power amplifier and at least one analog filter arranged along a transmit signal path and a feedback signal path.

19 Claims, 5 Drawing Sheets

(56) References Cited

U.S. PATENT DOCUMENTS

| | | |
|---|---|---|
| 2008/0049868 A1 | 2/2008 | Brobston |
| 2008/0130788 A1* | 6/2008 | Copeland .................... 375/297 |
| 2008/0139132 A1* | 6/2008 | Pan et al. ..................... 455/93 |
| 2008/0144539 A1 | 6/2008 | Sperlich et al. |
| 2008/0151974 A1* | 6/2008 | Jensen et al. ................ 375/219 |
| 2008/0238544 A1* | 10/2008 | Morris et al. ................ 330/149 |
| 2009/0093223 A1* | 4/2009 | McCune, Jr. ................ 455/126 |
| 2009/0170444 A1* | 7/2009 | Retnasothie et al. ........... 455/73 |
| 2009/0316838 A1 | 12/2009 | Fuller et al. |
| 2010/0098181 A1 | 4/2010 | Jacobsen et al. |
| 2010/0098191 A1* | 4/2010 | Morris et al. ................ 375/322 |
| 2010/0265851 A1* | 10/2010 | Shahar ........................ 370/278 |

OTHER PUBLICATIONS

International Search Report for PCT/IB2010/002941 mailed Sep. 14, 2011.
Written Opinion for PCT/IB2010/002941 mailed Sep. 14, 2011.
Japanese Office Action dated Nov. 28, 2014, in related Japanese Application No. JP 2013-539347.

* cited by examiner

METHOD AND FREQUENCY AGILE PRE-DISTORTED TRANSMITTER USING PROGRAMMABLE DIGITAL UP AND DOWN CONVERSION

TECHNICAL FIELD

The present invention generally relates to pre-distorted transmitters capable to transmit signals using digital down and up conversions that are programmable to accommodate a plurality of frequency bands.

BACKGROUND

Radio transmitters in most communication systems are required to be "linear", meaning that their output signal must accurately reproduce a frequency spectrum of a corresponding input signal. A non-linearity in the input/output relationship causes the output signal to spread onto adjacent radio frequencies and interfere with other radio channels. Pre-distortion is a technique of cancelling an initial non-linearity by altering the input signal to produce an overall linear input/output relationship. In a pre-distorted transmitter, a pre-distortion function applied to the input signal is adjusted based on a feedback signal. Since the distortion primarily occurs in the power amplifier, the signal acquired after the power amplifier is fed back and compared with the initial signal as part of the pre-distortion process.

Currently available pre-distorted transmitters are generally designed to operate for a single frequency band or a small range of transmitted frequencies (e.g. LTE band 1 or 2110-2170 MHz). Both a forward path and a feedback path in these pre-distorted transmitters are effectively tuned to the same frequency band, and cannot be deployed to support other frequency bands. The pre-distorted transmitters' operation in a single (narrow) frequency band of interest occurs as a result of a design which includes, for example, various tuned circuits (e.g., narrow band filters), a limited range of operation of components (e.g., voltage controlled oscillators that only tune only over a few hundred MHz), and amplitude and phase variation over frequency which makes linearization (e.g., pre-distortion) difficult over a broad range of frequencies.

The number and range of available frequency bands around the world has recently increased significantly. The currently available pre-distorted transmitters require that they be redesigned, modified and re-banded to operate in a new frequency range. This situation leads to many radio communication systems which are expensive to design and to support on an on-going basis.

Accordingly, it would desirable to have a frequency agile pre-distorted transmitter capable of being effectively tuned for plural frequency bands, thereby avoiding the afore-described problems and drawbacks.

SUMMARY

According to one exemplary embodiment, a transmitter operable over a wide range of frequencies including a plurality of predetermined frequency bands includes a baseband processing unit, a programmable digital up-converter, a digital to analog converter, an analog filter, a power amplifier, an analog to digital converter, and a programmable digital down-converter. The baseband processing unit is configured to receive a complex input signal and a feedback output signal, and to output a pre-distorted baseband signal based on said complex input signal and said feedback signal. The programmable digital up-converter is connected to the baseband processing unit, and is configured to receive the pre-distorted baseband signal, and to convert the pre-distorted baseband signal into a digital signal having a spectral content which is selected based on at least one first control input received from the baseband processing unit. The digital to analog converter is connected to the programmable digital up-converter, and is configured to receive the digital signal and to convert the digital signal in an analog signal. The analog filter is connected to the digital to analog converter, and is configured to receive the analog signal, and to output a filtered analog signal including substantially only components having frequencies in a selected one of the frequency bands. The power amplifier is connected to the analog filter, and is configured to receive the filtered analog signal, and to amplify the filtered analog signal. The analog to digital converter is configured to receive an analog feedback signal corresponding to the amplified filtered analog signal, to sample the analog feedback signal, and to output a digital feedback signal. The programmable digital down-converter is connected to the analog to digital converter and the baseband processing unit, and is configured to receive the digital feedback signal, and to convert the digital feedback signal to a lower sample rate based on at least one second control input, into the feedback signal, which is provided to the baseband processing unit.

According to one exemplary embodiment, a transmitter operable over a wide range of frequencies including a plurality of predetermined frequency bands includes a baseband processing unit, one or more forward signal paths, and a single feedback signal path. The baseband processing unit is configured to receive one or more complex baseband input signals, to output one or more pre-distorted signals corresponding to the one or more complex baseband input signals. The one or more forward signal paths are connected to the baseband processing unit, and are configured to digitally up-convert a respective one of the one or more complex baseband input signals, to convert the up-converted signal into an analog signal, amplify the analog signal and to broadcast the analog signal. The single feedback signal path is configured to receive an analog signal which corresponds to the one or more broadcasted signals, to convert analog signal into a digital signal at a fixed sampling rate, to down-sample the digital signal digitally and to output the down sampled signal to the baseband processing unit.

According to another exemplary embodiment, a method of broadcasting signals over a wide range of frequencies including a plurality of predetermined frequency bands is provided. The method includes generating a pre-distorted baseband signal and up-sampling digitally the pre-distorted signal to convert the pre-distorted baseband signal into a digital signal having spectral content which is selected based on at least one first control input. Further the method includes converting the digital signal into an analog signal, filtering the analog signal to include substantially only components having frequencies in a selected one of the frequency bands, and amplifying the filtered analog signal. The method further includes converting an analog feedback signal corresponding to the amplified filtered analog signal, into a digital feedback signal. The method also includes down-sampling the digital feedback signal to a lower sample rate based on at least one second control input, to output a feedback signal, wherein the pre-distorted baseband signal is generated from a complex input signal using a pre-distortion function adjustable based on the feedback signal.

According to another exemplary embodiment, a method of manufacturing a transmitter operable over a wide range of frequencies including a plurality of predetermined frequency bands includes mounting a programmable digital up-converter, a digital to analog converter, and an analog filter, along a transmit path on a substrate or a circuit board, between a baseband processing unit configured to output a pre-distorted signal and a power amplifier. The method further includes mounting an attenuator, an analog to digital converter and a programmable digital down-converter, along a feedback path on the substrate or the circuit board, between the power amplifier and the baseband processing unit. The programmable digital up-converter is configured to convert a pre-distorted baseband signal, into a digital signal based on at least one first control input. The programmable digital down-converter is configured to convert a digital feedback signal to a lower sample rate based on at least one second control input, into a feedback signal. The baseband processing unit is configured to generate the pre-distorted baseband signal based on a complex input signal using a pre-distorting function, which is adjustable based on the feedback signal.

It is an objective of the exemplary embodiments to overcome some of the deficiencies discussed in the previous section and to provide a frequency agile pre-distorted transmitter capable of being effectively configured for plural frequency bands.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of pre-distorted transmitters. However, the embodiments to be discussed next are not limited to these systems but may be applied to other existing radio communication systems.

Reference throughout the specification to "one embodiment" or "an embodiment" means that a particular feature, structure, or characteristic described in connection with an embodiment is included in at least one embodiment of the present invention. Thus, the appearance of the phrases "in one embodiment" or "in an embodiment" in various places throughout the specification is not necessarily all referring to the same embodiment. Further, the particular features, structures or characteristics may be combined in any suitable manner in one or more embodiments.

According to exemplary embodiments, a wideband transmitter can be implemented using a programmable digital up-converter in a transmit path, and a programmable digital down converter in a feedback path. By using a digital down-converter in the feedback path, errors which would otherwise be caused by analog components (e.g., due to time, voltage, and/or temperature variations) are not promulgated back through signals on the transmit path. Moreover by using programmable digital converters in the transmit path and the feedback path, the response of the transmission system can be of the same quality across a wide range of frequency bands. By way of contrast, converters which employ analog components may be tuned to have optimal response in a single frequency band, but will behave differently (thus, introducing errors) in other frequency bands of operation.

Figure 1:
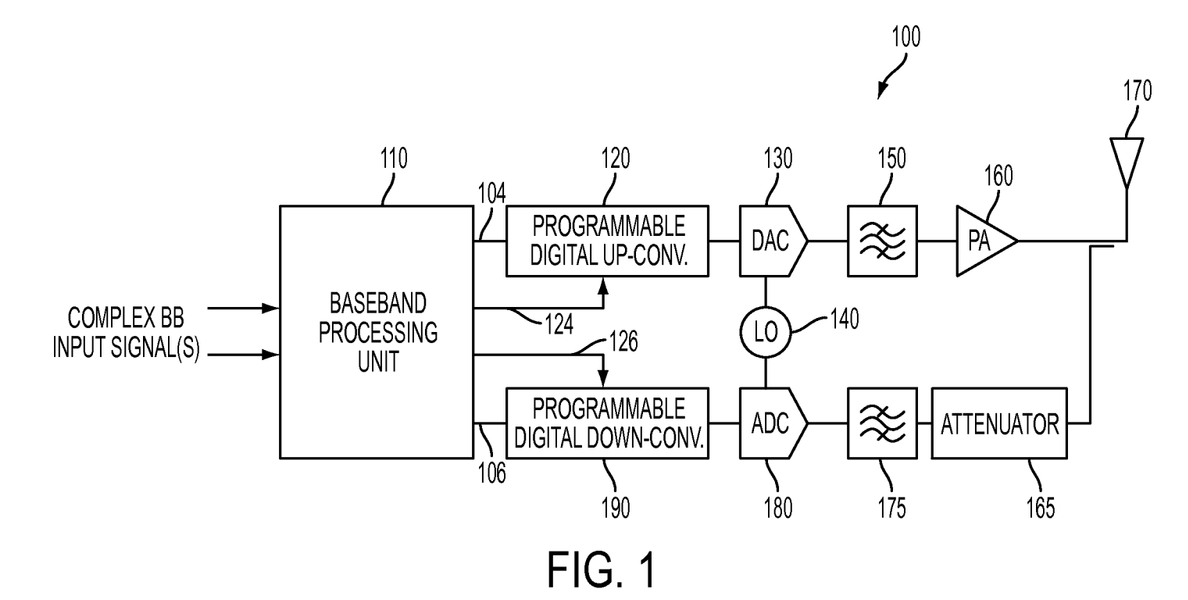
FIG. 1 is a schematic diagram of a pre-distorted transmitter according to an exemplary embodiment.

According to an exemplary embodiment illustrated in FIG. 1, a frequency agile pre-distorted transmitter 100 is configured to operate over a wide range of frequencies including a plurality of predetermined frequency bands. The transmitter 100 includes a baseband processing unit 110 configured to receive a complex input signal and a feedback signal, and to output a pre-distorted baseband signal. Thus, the baseband processing unit 110 is the start point of a transmission signal path 104 and the end point of a feedback signal path 106. Although the pre-distorted baseband signal is a baseband signal, note that the feedback signal may be a baseband signal or an intermediate frequency (IF) signal.

The pre-distorted baseband signal output by the baseband processing unit 110 is a pre-distorted signal obtained by applying a pre-distortion function. Applying the pre-distortion function is intended to provide a linear relationship between the complex input signal and the signal at the end of the transmission path. The higher the quality of the feedback signal, the more capable the baseband processing unit 110 will be to achieve this linear relationship. In contrast with the conventional pre-distorted transmitter, in which the feedback path has to be retuned when the frequency band is changed, the frequency agile pre-distorted transmitter 100 is capable of providing the same high quality feedback signal for all of the covered frequency bands. The pre-distortion function may be initially a predetermined function (based, e.g., on modeling the power amplifier), but can be adjusted based on the comparison of the complex input signal with the feedback signal. Pre-distortion of signals to be transmitted is, per se, known in the art and, therefore, not described in more detail here.

The pre-distorted baseband signal is up-converted as a digital signal by a programmable digital up-converter 120 connected to the baseband processing unit 110. The digital signal has a spectral content which is selected based on at least one first control input received from the baseband processing unit 110 via control line 124. The at least one first control input provided to the programmable digital up-converter includes at least one of: filter information associated with a selected one of the predetermined frequency bands, a complex tuner frequency and an up-sampling parameter N associated with the selected one of the predetermined frequency bands.

Figure 2:
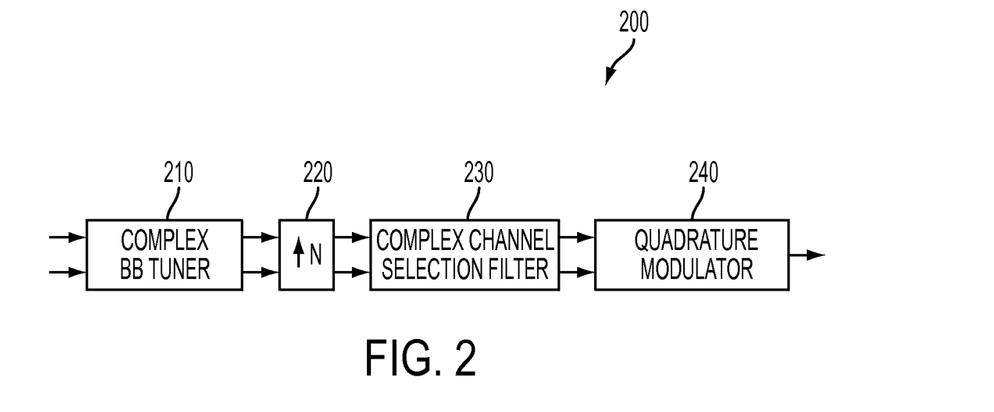
FIG. 2 is a schematic diagram of a programmable digital up-converter included in an apparatus according to an exemplary embodiment.

An example of a programmable digital up-converter 120 is described in U.S. Patent Application Publication 2010/0098191, the disclosure of which is incorporated herewith by reference in its entirety. FIG. 2 is a schematic diagram of a programmable digital up-converter 200 which may be included in a pre-distorted transmitter (e.g., the programmable digital up-converter 120 in the frequency agile pre-distorted transmitter 100 in FIG. 1) according to an exemplary embodiment. The programmable digital up-converter 200 according to this exemplary embodiment includes a complex tuner 210, a digital up-sampler 220, an complex channel selection filter 230 and a quadrature modulator 240, which may be arranged between a baseband processing unit (e.g., 110 in FIG. 1) and a digital to analog converter (e.g., 130 in FIG. 1).

Due to the presence of a digital up-sampler (e.g., 220 in FIG. 2) the programmable digital up converter 120 converts a baseband input signal into a digital signal having a spectral content which is selected based on at least one first control input. For example, an up-sampling parameter N used by the digital up-sampler 220 may depend on a selected frequency band for the signal to be transmitted, as well as a sampling rate used in the transmit path. The programmable digital up-converter 120 may receive the up-sampling parameter N, or other information associated with the selected frequency band, from the baseband processing unit 110, via a control path 124, which is different than the transmission signal path 104.

Thus, the digital up-sampler 220 may generate a digital signal that includes N values (i.e., samples) for each sample in a digital signal input to the up-sampler 220, where N is larger than or equal to 2. In order to simplify the hardware, the added samples may, for example, be zero values requiring no calculation. Since N is typically a power of 2, a rate change filter may be included in the programmable digital up-converter to bridge a sample rate of the signal input to the programmable digital up-converter, and a desired predetermined sample rate of the signal output from the programmable digital up-converter, which is used by the DAC. The rate change filter is a device configured to output a digital signal having a sample rate which is a fraction of the sample rate of a digital signal input to the rate change filter.

The digital signal output from the programmable digital up-converter 120 is then converted into an analog signal by the digital to analog converter (DAC) 130, which operates at a predetermined DAC rate. To operate at this predetermined DAC rate, the DAC 130 receives a local oscillator signal having a predetermined frequency corresponding to the predetermined DAC rate, for example, from a local oscillator 140.

The analog signal output by the DAC 130, is then filtered by the analog filter 150, and the filtered analog signal is input to a power amplifier (PA) 160 prior to being transmitted via an antenna 170. The analog filter 150 filters the analog signal to output only components with frequencies within all or a part of a single Nyquist zone. For example, if the DAC 130 operates at 2.5 GSps, the analog filter 150 can isolate most of the first Nyquist zone (0 to 1.25 GHz) and hence supports all bands within that region, e.g., 450 to 960 MHz.

A feedback analog signal corresponding to the amplified filtered signal is fed back to the baseband processing unit 110 via the feedback signal path 106. The feedback analog signal may be received from the PA 160 via an attenuator 165.

Along the feedback signal path 106, the feedback analog signal is converted to a digital feedback signal by an analog to digital converter (ADC) 180 operating at a predetermined ADC rate. This predetermined ADC rate may be the same as the predetermined DAC rate of the DAC 130. However, the invention is not limited by this feature. In order to perform the analog to digital conversion at the predetermined ADC rate, the ADC 180 uses a local oscillation signal. If the predetermined ADC rate is the same as the predetermined DAC rate, the ADC 180 may use the same local oscillator 140 as the DAC 130. Using the same local oscillator 140 is advantageous because any variation of the local oscillation frequency affects equally the transmit signal path 104 (i.e., the DAC 130) and the feedback signal path 106 (i.e., the ADC 180). Alternatively, however, two different local oscillators may be used to provide local oscillation (clock) signals to DAC 130 and ADC 180, respectively. The predetermined ADC and DAC rates may, for example, be larger than 1 GSps.

Figure 3:
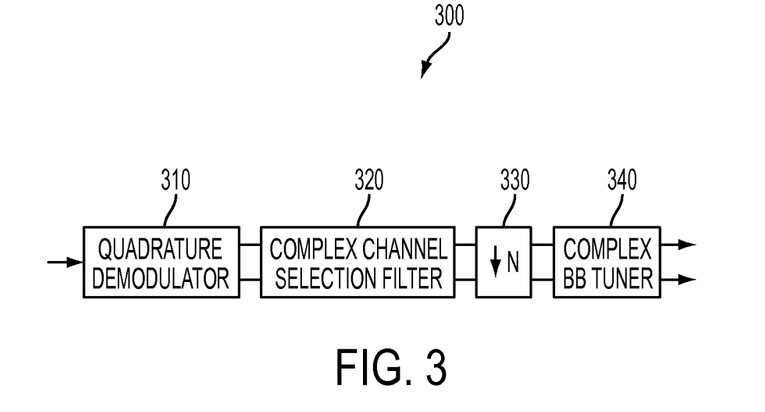
FIG. 3 is a schematic diagram of a programmable digital down-converter included in an apparatus according to an exemplary embodiment.

The digital feedback signal output by the ADC 180 is then input to a programmable digital down-converter 190. FIG. 3 is a schematic diagram of a programmable digital down-converter 300 usable in various embodiments of frequency agile pre-distorted transmitters. The digital down converter 300, which is connected between an analog to digital converter (e.g., 180 in FIG. 1) and a baseband processing unit (e.g., 110 in FIG. 1) includes a quadrature demodulator 310, a complex channel selection filter 320, a digital down-sampler 330, and a complex baseband tuner 340. The complex baseband tuner 340 may alternatively be included in the baseband processing unit 110, and in this case, the signal output by the programmable digital down-converter has an intermediate frequency (IF), which may be zero. The functionality of the complex channel selection filter 320 and the digital down-sampler 330 may be achieved by using a polyphase filter. The polyphase filter may also include the quadrature demodulator.

Due to the presence of a digital down-sampler (e.g., 330 in FIG. 3) the programmable digital down converter 190 converts the digital feedback signal, into the feedback signal having a lower sample rate depending on at least one second control input. The at least one second control input provided to the programmable digital down-converter 190 includes, for example, at least one of: filter information associated with a selected one of the predetermined frequency bands, complex tuner frequency and a down-sampling parameter N associated with the selected one of the predetermined frequency bands. The programmable digital down-converter 190 may receive the down-sampling parameter N or other information on the selected frequency band from the baseband processing unit 110, via a control path 126, which is different than the feedback signal path 106.

The digital down-sampler 330 may generate a down-sampled signal that includes one sample for each N samples in a digital signal input to the down-sampler 330, where N is larger than or equal to 2. Since N is preferred to be a power of 2, a rate change filter (as described above) may be included in the programmable digital down-converter to bridge a predetermined sample rate of the signal input to the programmable digital down-converter divided by N, to the desired sample rate of the signal output from the programmable digital down-converter. For example, suppose (as a purely illustrative numerical example) that the input sample rate to the programmable digital down-converter is 2488.32 MSps, N=8, and the output sample rate from the programmable digital down-converter (without a rate change filter) is 311.04, but the desired output sample rate is 245.76. To bridge these latter two values, a rate change filter performing 64/81 re-sampling can be provided at any point in the signal processing chain shown in FIG. 3, but preferably after the complex baseband tuner 340.

If there is minimal interference (e.g. something other than the transmitted signal) from the antenna 170 coupled back in the feedback signal path 106, then a filter is not required prior to the ADC 180 on the feedback signal path 106. All required filtering may then be achieved digitally during the down-conversion process, for example, by judicious selection of the polyphase filter coefficients in the programmable digital down-converter 190. However, optionally, an analog feedback filter 175 may be included in the pre-distorted transmitter 100, to protect the ADC 180 from overload due to interfering signals.

A pre-distorted transmitter including a digital up-converter and a digital down-converter according to exemplary embodiments ensures a nominally flat frequency response (magnitude and linear phase) and repeatability (manufacturing). As the frequency response of the digital up-converter and the digital down-converter is fully defined by the digital signal processing, a frequency agile pre-distorted transmitter can be developed. In other words, a pre-distorted transmitter including a digital up-converter and a digital down-converter is configured to be operated for plural predetermined frequency bands within a wide frequency range.

An important advantage of the pre-distorted transmitter including a programmable digital up-converter and a programmable digital down-converter is that it enables a frequency agile pre-distorted transmitter thereby substantially reducing the number of radios required to support the large number of frequency bands around the world. For example, on January 2010, there were 23 bands below 2.2 GHz designated for use in LTE (Long Term Evolution) communication systems. With the DAC/ADC sampling at 2.5 GSps, a single transmitter design, according to exemplary embodiments, having two different image selection filters could be used to cover all the frequency bands.

Programmable digital up-converters and programmable digital down-converters of various architectures according to these exemplary embodiments are suitable to be implemented as integrated circuits and take advantage of the continuous miniaturization. Moreover, the fewer components require less board area.

Because both the transmission signal path (e.g., 104) and the feedback path (e.g., 106) are linear according to the exemplary embodiments, it becomes easier to build apparatuses including multi-input power amplifiers (i.e., with multiple forward paths). Moreover, the feedback path of the architecture may be used for several forward paths.

Figure 4:
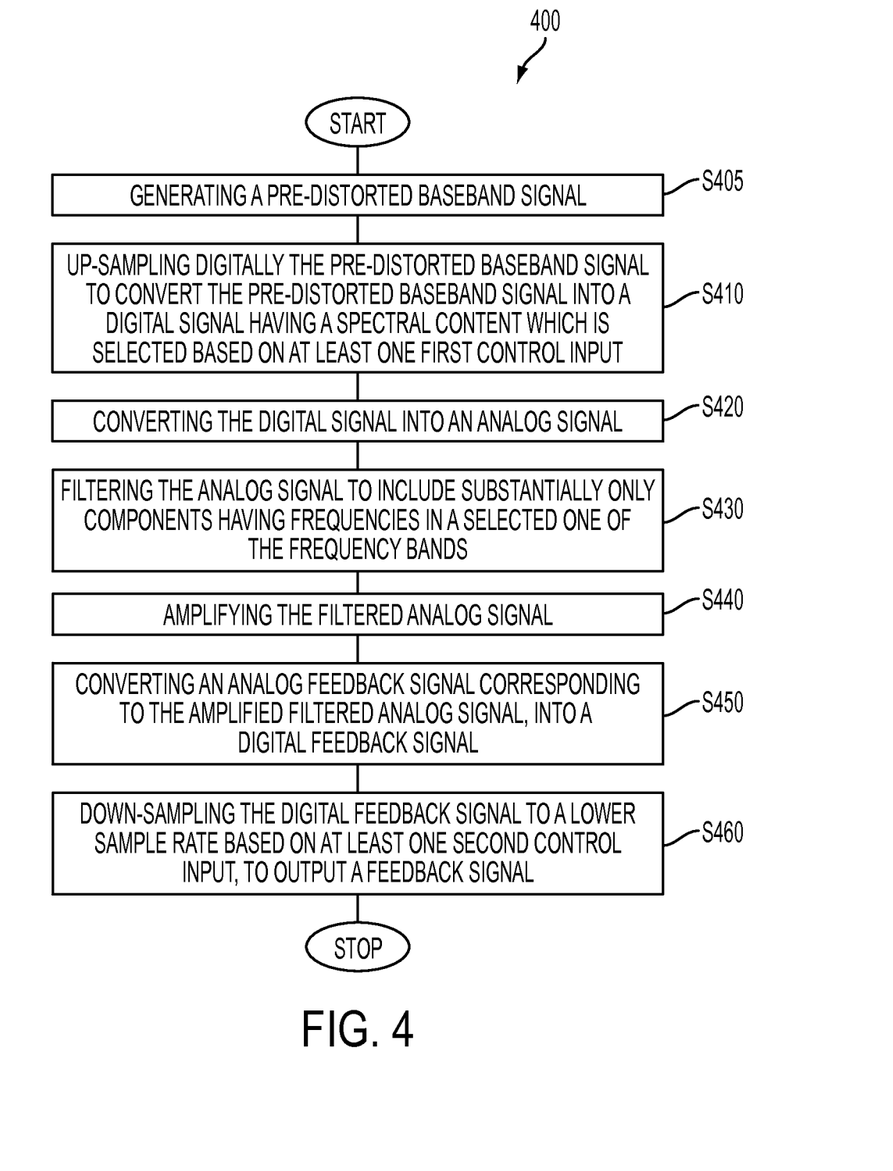
FIG. 4 is a flow chart of a method performed to achieve frequency agile pre-distorted transmission according to an exemplary embodiment.

The flow chart of a method 400 of transmitting signals over a wide range of frequencies including a plurality of predetermined frequency bands according to an exemplary embodiment is illustrated in FIG. 4. The method 400 may be performed, for example, by the transmitter 100 illustrated in FIG. 1. At S405, the method 405 includes generating a pre-distorted baseband signal. At S410, the method 400 includes digitally up-sampling the pre-distorted baseband signal to convert the pre-distorted baseband signal into a digital signal having a spectral content which is selected based on at least one first control input. The method 400 includes converting the digital signal into an analog signal, at S420, filtering the analog signal to include substantially only components having frequencies in a selected one of the frequency bands, at S430, and amplifying the filtered analog signal at S440. The operations at S410, S420, S430 and S440 are operations related to a transmission signal path (e.g., 104) in a transmitter, towards an emitting antenna (e.g., 170) that is configured to transmit the amplified filtered analog signal.

At S450, the method 400 further includes converting an analog feedback signal corresponding to the amplified filtered analog signal into a digital feedback signal. The analog feedback signal may be an attenuated version of the amplified analog signal. At S460, the method 400 includes down-sampling the digital feedback signal to a lower sample rate based on at least one second control input, to output a feedback signal. The pre-distorted baseband signal is generated from a complex input signal using a pre-distortion function adjustable based on the feedback signal.

Figure 5:
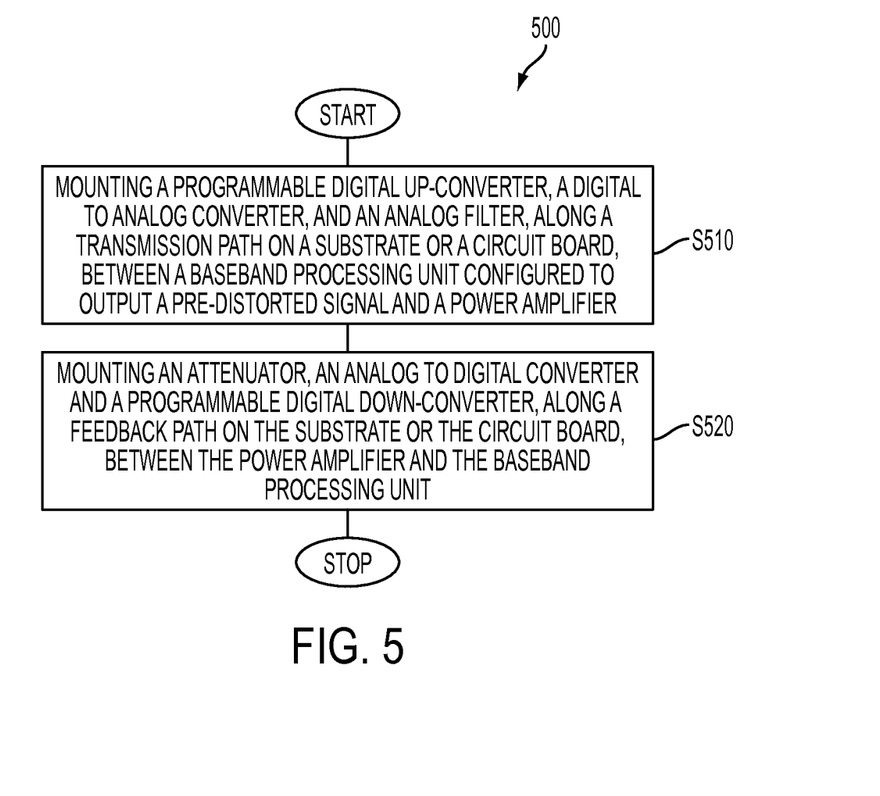
FIG. 5 is a flow chart of a method of manufacturing a frequency agile pre-distorted transmitter according to an exemplary embodiment.

The flow chart of a method 500 of manufacturing a transmitter operable over a wide range of frequencies including a plurality of predetermined frequency bands according to an exemplary embodiment is illustrated in FIG. 5. At S510, the method 500 includes mounting a programmable digital up-converter, a digital to analog converter, and an analog filter, along a transmission path on a substrate or a circuit board, between a baseband processing unit configured to output a pre-distorted signal and a power amplifier. Further, at S520, the method 500 includes mounting an attenuator, an analog to digital converter and a programmable digital down-converter along a feedback path on the substrate or the circuit board, between the power amplifier and the baseband processing unit. The programmable digital up-converter in the method 500 is configured to convert a pre-distorted baseband signal into a digital signal based on at least one first control input. The programmable digital down-converter in the method 500 is configured to convert a digital feedback signal to a lower sample rate based on at least one second control input, into a feedback signal. The baseband processing unit is configured to generate the pre-distorted baseband signal based on a complex input signal using a pre-distorting function, which is adjustable based on the feedback signal.

The method 500 may further include mounting a local oscillator on the substrate or the circuit board, and connecting the local oscillator to the analog to digital converter and the digital to analog converter.

The method 500 may also include mounting an analog feedback filter on the substrate or the circuit board, between the attenuator and the analog to digital converter, or before the attenuator. The method 500 may include connecting the programmable digital up-converter and the programmable digital down-converter to the baseband processing unit via control paths other than the transmission path and the feedback path, the control paths being configured to allow the baseband processing unit to provide the at least one first control input and the at least one second control input to the programmable digital up-converter and the programmable digital down-converter, respectively.

The mounting of the of the programmable digital up-converter at S510 may include mounting a complex baseband tuner, a digital up-sampler, a complex channel selection filter and a quadrature modulator between the baseband processing unit and the digital to analog converter, on the transmission path.

The mounting of the of the programmable digital down-converter at S520 may include mounting a quadrature demodulator, a complex channel selection filter, a digital down converter and a complex baseband tuner between the analog to digital converter and the baseband processing unit, along the feedback path. Alternatively, in another embodiment, the mounting of the programmable digital down-converter at S520 may include mounting a quadrature demodulator, a polyphase filter and a complex baseband tuner between the analog to digital converter and the baseband processing unit, along the feedback path.

Although the features and elements of the present exemplary embodiments are described in the embodiments in particular combinations, each feature or element can be used alone without the other features and elements of the embodiments or in various combinations with or without other features and elements disclosed herein.

What is claimed is:

1. A transmitter operable over a wide range of frequencies including a plurality of predetermined frequency bands, comprising:

a baseband processing unit configured to receive a digital complex input signal and a first digital feedback signal, to compare the digital complex input signal with the first digital feedback signal, and to apply a pre-distortion function to output a pre-distorted baseband signal generated based on said digital complex input signal and said first digital feedback signal, said pre-distortion function being adjustable based on the comparison of said digital complex input signal with said first digital feedback signal;

a programmable digital up-converter connected to the baseband processing unit, and configured to receive the pre-distorted baseband signal, and to convert the pre-distorted baseband signal into a digital signal in a selected one of the predetermined frequency bands according to at least one first control input received from the baseband processing unit, wherein the programmable digital up-converter comprises a complex baseband tuner, a digital up-sampler, a complex channel selection filter, a quadrature modulator, and a rate change filter configured to change a sample rate of a signal being processed in said programmable digital up-converter;

a digital to analog converter connected to the programmable digital up-converter, and configured to receive the digital signal and to convert the digital signal to an analog signal;

an analog filter connected to the digital to analog converter, and configured to receive the analog signal, and to output a filtered analog signal including substantially only components having frequencies in the selected one of the frequency bands;

a power amplifier connected to the analog filter, and configured to receive the filtered analog signal, and to amplify the filtered analog signal;

an analog to digital converter configured to receive an analog feedback signal corresponding to the amplified filtered analog signal, to sample the analog feedback signal, and to output a second digital feedback signal; and a programmable digital down-converter connected to the analog to digital converter and the baseband processing unit, and configured to receive the digital feedback signal, to convert the second digital feedback signal to a lower sample rate based on at least one second control input, into the first digital feedback signal, which is provided to the baseband processing unit.

2. The transmitter of claim 1, further comprising:
an attenuator connected to the analog to digital converter, the attenuator being configured to attenuate the analog feedback signal, and to transmit an attenuated analog feedback signal towards the analog to digital converter.

3. The transmitter of claim 1, further comprising:
a local oscillator configured to provide a clock signal to the digital to analog converter and to the analog to digital converter.

4. The transmitter of claim 1, further comprising: an analog feedback filter connected to the analog to digital converter and configured to filter the analog feedback signal to exclude components having frequencies outside the predetermined selected one of the frequency bands.

5. The transmitter of claim 1, wherein the second digital feedback signal is an intermediate frequency signal.

6. The transmitter of claim 1, wherein the second digital feedback signal is a baseband signal.

7. The transmitter of claim 1, wherein the programmable digital down-converter comprises a quadrature demodulator, a complex channel selection filter, a digital down-sampler and a complex baseband tuner.

8. The transmitter of claim 7, wherein the programmable digital down-converter further comprises:

a rate change filter configured to change a sample rate of a signal being processed in said programmable digital down-converter.

9. The transmitter of claim 1, wherein the programmable digital down-converter comprises a quadrature demodulator, a polyphase filter and a complex baseband tuner.

10. The transmitter of claim 1, wherein the programmable digital down-converter comprises a polyphase filter and a complex baseband tuner when N is a multiple of 4, wherein N is a down sampling parameter associated with the selected one of the predetermined frequency band.

11. The transmitter of claim 1, wherein the at least one first control input provided to the programmable digital up-converter includes at least one of: filter information associated with a selected one of the predetermined frequency bands, complex tuner frequency and an up-sampling parameter associated with the selected one of the predetermined frequency bands.

12. The transmitter of claim 1, wherein the at least one second control input provided to the programmable digital down-converter includes at least one of: filter information associated with the selected one of the predetermined frequency bands, complex tuner frequency and a down-sampling parameter associated with the selected one of the predetermined frequency bands.

13. A transmitter operable over a wide range of frequencies including a plurality of predetermined frequency bands, comprising:

a baseband processing unit configured to receive digital complex baseband input signals and a first digital feedback signal, to compare the digital complex baseband input signals with the first digital feedback signal, and to apply a pre-distortion function to output pre-distorted signals corresponding to the digital complex baseband input signals, said pre-distortion function being adjustable based on the comparison of the first digital complex baseband input signals and the digital feedback signal;

transmit signal paths connected to the baseband processing unit, each of the transmission paths being configured to digitally up-convert one of the pre-distorted signals to one of the frequency bands, to convert the up-converted signal into an analog signal, to amplify the analog signal and to transmit the amplified analog signal, wherein the transmit signal paths include a programmable digital up-converter to up-convert one of the pre-distorted signals, wherein the programmable digital up-converter comprises a complex baseband tuner, a digital up-sampler, a complex channel selection filter, a quadrature modulator, and a rate change filter configured to change a sample rate of a signal being processed in said programmable digital up-converter; and a feedback signal path configured to receive at least one analog feedback signal which corresponds to the transmitted signals, to convert said at least one analog signal into a second digital signal at a fixed sampling rate, to digitally down-sample the second digital signal, and to output the down sampled signal as the first digital feedback signal to the baseband processing unit.

14. A method of manufacturing a transmitter operable over a wide range of frequencies including a plurality of predetermined frequency bands, the method comprising:

mounting a programmable digital up-converter, a digital to analog converter, and an analog filter, along a transmission path on a substrate or a circuit board, between a baseband processing unit configured to output a pre-distorted signal and a power amplifier, wherein the mounting of the programmable digital up-converter comprises mounting a complex baseband tuner, a digital up-sampler, a complex channel selection filter, a quadrature modulator, and a rate change filter between the baseband processing unit and the digital to analog converter, on the transmission path, wherein the rate change filter is configured to change a sample rate of a signal being processed in said programmable digital up-converter; and mounting an attenuator, an analog to digital converter and a programmable digital down-converter, along a feedback path on the substrate or the circuit board, between the power amplifier and the baseband processing unit, wherein the programmable digital up-converter is configured to convert a pre-distorted baseband signal into a digital signal in a selected one of the predetermined frequency bands according to at least one first control input, the programmable digital down-converter is configured to convert a digital feedback signal to a lower sample rate based on at least one second control input, into a lower sample rate digital feedback signal, and the baseband processing unit is configured to compare a digital complex input signal with the lower sample rate digital feedback signal, and to generate the pre-distorted baseband signal based on a digital complex input signal using a pre-distorting function, which is adjustable based on the comparison of the digital complex input signal and the lower sample rate digital feedback signal.

15. The method of manufacturing of claim 14, further comprising:

mounting a local oscillator on the substrate or the circuit board; and connecting the local oscillator to the analog to digital converter and the digital to analog converter.

16. The method of manufacturing of claim 14, further comprising:

mounting an analog feedback filter on the substrate or the circuit board between the attenuator and the analog to digital converter or before the attenuator.

17. The method of claim 14, further comprising:

connecting the programmable digital up-converter and the programmable digital down-converter to the baseband processing unit via control paths other than the transmission path and the feedback path, the control paths being configured to allow the baseband processing unit to provide the at least one first control input and the at least one second control input to the programmable digital up-converter and the programmable digital down-converter, respectively.

18. The method of claim 14, wherein the mounting of the programmable digital down-converter comprises:

mounting a quadrature demodulator, a complex channel selection filter, a digital down sampler and a complex baseband tuner between the analog to digital converter and the baseband processing unit, along the feedback path.

19. The method of claim 14, wherein the mounting of the programmable digital down-converter comprises:

mounting a quadrature demodulator, a polyphase filter and a complex baseband tuner between the analog to digital converter and the baseband processing unit, along the feedback path.

* * * * *